(12) United States Patent
Hitani et al.

(10) Patent No.: US 7,345,340 B2
(45) Date of Patent: Mar. 18, 2008

(54) SEMICONDUCTOR INTEGRATED CIRCUIT AND A SEMICONDUCTOR DEVICE

(75) Inventors: Mitsuharu Hitani, Kodaira (JP); Toshio Nagasawa, Takasaki (JP); Akihiro Tamura, Takasaki (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 11/254,145

(22) Filed: Oct. 20, 2005

(65) Prior Publication Data

US 2006/0086973 A1   Apr. 27, 2006

(30) Foreign Application Priority Data

Oct. 21, 2004  (JP) .............................. 2004-306473

(51) Int. Cl.
*H01L 23/62* (2006.01)

(52) U.S. Cl. ...................... 257/335; 257/327; 257/336; 257/337; 257/338; 257/339; 257/340; 257/341; 257/342; 257/E27.033; 326/83; 323/282; 323/283; 315/287

(58) Field of Classification Search ................ 257/327, 257/335–342, E27.033; 326/83; 323/282, 323/283; 315/287
See application file for complete search history.

(56) References Cited

U.S. PATENT DOCUMENTS 6,911,694 B2 * 6/2005 Negoro et al. .............. 257/336

FOREIGN PATENT DOCUMENTS

| JP | 2000-022142 | 1/2000 |
|---|---|---|
| JP | 2001-308321 | 11/2001 |
| JP | 2002-176173 | 6/2002 |

* cited by examiner

*Primary Examiner*—Lynne Gurley
*Assistant Examiner*—Meiya Li
(74) *Attorney, Agent, or Firm*—Mattingly, Stanger, Malur & Brundidge, PC

(57) ABSTRACT

A semiconductor integrated circuit that has a quick response to changes in source/drain electrode voltage having an LDMOS transistor. The transistor has a second conduction type first well region formed in a first conduction type semiconductor substrate; a first conduction type second well region formed in the first well region; a second conduction type third well region formed in the second well region; a drain region formed in the second well region; a source region formed in the third well region; a gate electrode formed through a gate insulating film over the third well region between the drain region and the source region; and an insulating layer formed between the gate electrode and the drain region. Parasitic capacitances between the semiconductor substrate and the source region and those between the substrate and the drain region are respectively in series.

5 Claims, 12 Drawing Sheets

SEMICONDUCTOR INTEGRATED CIRCUIT AND A SEMICONDUCTOR DEVICE

CROSS-REFERENCE TO RELATED APPLICATION

The present application claims priority from Japanese patent application No. 2004-306473 filed on Oct. 21, 2004, the content of which is hereby incorporated by reference into this application.

BACKGROUND OF THE INVENTION

The present invention relates to the structure of an LD (Lateral Double Diffused) MOS transistor as a high breakdown voltage element.

Patent Document 1 (Japanese Unexamined Patent Publication No. 2000-22142, FIG. 1) discloses the structure of a P-channel LDMOS transistor. In this structure, for an N-type semiconductor substrate, an N-channel well region and a drain region are formed in a P-type well region formed over the semiconductor substrate; a source region is formed in the N-channel well and a gate electrode is formed through an insulating film over the N-channel well region. For a P-type semiconductor substrate, a P-type well region is formed in an N-type well region formed over the semiconductor substrate and a drain region is formed there; a source region is formed in the N-type well region and a gate electrode is formed through an insulating film over the N-type well region.

Patent Document 2 (Japanese Unexamined Patent Publication No. 2001-308321, FIG. 7) and Patent Document 3 (Japanese Unexamined Patent Publication No. 2002-176173, FIG. 8) disclose the structure of an N-channel LDMOS transistor. In this structure, a P-type low-concentration impurity region and an N-type low-concentration impurity region are formed in an N-type well region formed over a P-type semiconductor substrate; a drain region is formed in the N-type low-concentration impurity region; a source region is formed in the P-type low-concentration impurity region; and a gate electrode is formed over the P-type impurity region through an insulating film.

SUMMARY OF THE INVENTION

The present inventors examined parasitic capacitances with a semiconductor substrate in an LDMOS transistor. The LDMOS transistor that the inventors conceived includes: an N-type first well region formed in a P-type semiconductor substrate; a P-type second well region formed in the first well region; a drain region formed in the second well region; a source region formed in the first well region; a gate electrode formed over the first well region between the drain region and the source region through a gate insulating film; and an insulating layer such as a LOCOS film formed between the gate electrode and the drain region. In this LDMOS transistor, a relatively large breakdown voltage is ensured between the drain and source because the drain is separated from the source through the second well region, and a relatively large breakdown voltage is ensured between the drain and gate because the gate is separated from the drain through the insulating layer such as a LOCOS film. Here, between the drain and source of the LDMOS transistor there is a parasitic capacitance of the junction of the first well region and the second well region; between the drain and substrate there are a parasitic capacitance of the junction of the semiconductor substrate and the first well region and a parasitic capacitance of the junction of the first well region and the second well region in series; and between the source and substrate there is a parasitic capacitance of the junction of the semiconductor substrate and the first well region. As the source (drain) voltage of the LDMOS transistor changes, parasitic capacitances with the semiconductor substrate function as unwanted delay components. The inventors have found that, when the above LDMOS transistor is serially connected as a clamping MOS transistor between an input MOS transistor and a load MOS transistor and a level shift circuit is configured in which the source of the clamping MOS transistor serves as an output as the input MOS transistor is turned ON or OFF, the parasitic capacitance with the source looks larger than the above series of parasitic capacitances because of the LDMOS transistor device structure and thus there occurs a delay in the follow-up of the LDMOS transistor source voltage to the ON/OFF operation of the input transistor and consequently level shift operation cannot be sped up. Particularly the inventors have found that, when for prevention of through current in push-pull output transistors of a switching regulator, push-pull operation is controlled so as to create, during a switching transition period, a dead time in which both the transistors are turned off, if the above level shift circuit is used for the push-pull operation control, a delay in follow-up of the LDMOS transistor source voltage might increase the dead time. It has been demonstrated that such dead time increase would increase internal loss of current caused by the push-pull transistor body diode and theoretically such internal loss should be several tens of times larger than loss caused by push-pull transistor on-resistance. No such observation or idea is seen in the abovementioned patent documents concerning LDMOS transistors.

An object of the present invention is to provide a semiconductor integrated circuit including an LDMOS transistor which quickens the follow-up response to change in the source/drain electrode voltage.

Another object of the present invention is to provide a semiconductor device which shortens the dead time for push-pull output transistors of a switching regulator.

A further object of the present invention is to provide an electronic circuit in which power loss due to a switching regulator is small.

The above and further objects and novel features of the invention will more fully appear from the following detailed description in this specification and the accompanying drawings.

Typical aspects of the invention will be briefly outlined below.

According to one aspect of the present invention, a semiconductor integrated circuit has an LDMOS transistor formed over a first conduction type semiconductor substrate. The LDMOS transistor includes: a second conduction type first well region formed in the first conduction type semiconductor substrate; a first conduction type second well region formed in the first well region; a second conduction type third well region formed in the second well region; a drain region formed in the second well region; a source region formed in the third well region; a gate electrode formed through a gate insulating film over the third well region between the drain region and the source region; and an insulating layer formed between the gate electrode and the drain region.

In the LDMOS transistor, a relatively large breakdown voltage is ensured between the drain and source because the drain is separated from the source through the second and third well regions, and a relatively large breakdown voltage is ensured between the drain and gate because the gate is separated from the drain through an insulating layer such as a LOCOS film. Here, between the drain and source of the LDMOS transistor there is a parasitic capacitance of the junction of the first well region and the second well region; between the drain and substrate there are a parasitic capacitance of the junction of the semiconductor substrate and the first well region and a parasitic capacitance of the junction of the first well region and the second well region in series; and between the source and substrate there are a parasitic capacitance of the junction of the semiconductor substrate and the first well region, a parasitic capacitance of the junction of the first well region and the second well region, and a parasitic capacitance of the junction of the second well region and the third well region in series. As the source (drain) voltage of the LDMOS transistor changes, the parasitic capacitances with the semiconductor substrate function as unwanted delay components; however, because of the device structure, the parasitic capacitances with the source and those with the drain, which are respectively treated as the series of parasitic capacitances as mentioned above, look relatively small, so that delay in follow-up response to change in the source/drain electrode voltage, namely delay in change in the drain (source) voltage as a follow-up to change in the source (drain) voltage, is relatively small. This quickens the follow-up response to change in the source/drain electrode voltage in the LDMOS transistor.

In a preferred embodiment of the invention, the first conduction type refers to P type and the second conduction type refers to N type, and the LDMOS transistor is of the P-channel type.

In a further preferred embodiment of the invention, the semiconductor integrated circuit has a level shift circuit which uses the P-channel LDMOS transistor, and the level shift circuit includes: a pair of N-channel differential input MOS transistors; a pair of P-channel clamping MOS transistors which are connected with the drains of the differential input MOS transistors respectively; and a pair of P-channel load MOS transistors which are connected with the sources of the clamping MOS transistors respectively. Here, the P-channel clamping MOS transistors are the LDMOS transistors. The pair of load MOS transistors are cross-connected where the gate electrode of one transistor is connected with the drain electrode of the other transistor and the gate electrode of the other transistor is connected with the drain electrode of the one transistor, and in response to a differential input supplied to the pair of differential input MOS transistors, a signal which is level-shifted with respect to the amplitude of the differential input is outputted from the source electrodes of the pair of clamping MOS transistors.

According to another aspect of the invention, a semiconductor device constitutes a stepdown switching regulator which has a first power MOS transistor and a second power MOS transistor, both designed for push-pull operation, and a driver IC which generates a switching control signal to drive the first power MOS transistor and the second power MOS transistor for push-pull operation. The driver IC includes: a first logical circuit which receives a clock signal with an amplitude determined by a first operating supply voltage, generates a switch control signal for the first power MOS transistor and operates at the first operating supply voltage; a level shift circuit which shifts the amplitude of the clock signal to a second operating supply voltage, a level higher than the first operating supply voltage; and a second logical circuit which receives output from the level shift circuit, generates a switch control signal for the second power MOS transistor, and operates at the second operating supply voltage. The first logical circuit turns On the first power MOS transistor after the second power MOS transistor is turned Off; and the second logical circuit turns On the second power MOS transistor after the first power MOS transistor is turned Off. The level shift circuit includes: a pair of N-channel differential input MOS transistors; a pair of P-channel clamping MOS transistors which are connected with the drains of the differential input MOS transistors respectively; and a pair of P-channel load MOS transistors which are connected with the sources of the clamping MOS transistors respectively. The pair of load MOS transistors is cross-connected where the gate electrode of one transistor is connected with the drain electrode of the other transistor and the gate electrode of the other transistor is connected with the drain electrode of the one transistor. An inverted signal and a noninverted signal of the clock signal are inputted into the pair of differential input MOS transistors and in response to this input, a level-shifted signal with respect to the amplitude of the differential input is outputted from the source electrodes of the pair of clamping MOS transistors. The P-channel clamping MOS transistors are LDMOS transistors. The LDMOS transistor includes: an N-type first well region formed in a P-type semiconductor substrate; a P-type second well region formed in the first well region; an N-type third well region formed in the second well region; a drain region formed in the second well region; a source region formed in the third well region; a gate electrode formed through a gate insulating film over the third well region between the drain region and the source region; and an insulating layer formed between the gate electrode and the drain region.

The LDMOS transistors which function as the P-channel clamping MOS transistors quicken the follow-up response to change in the source/drain electrode voltage as mentioned above. In order to prevent through current in push-pull output transistors of the switching regulator, the first logical circuit and the second logical circuit control push-pull operation in a way to create, in a switching transition period, dead time in which both the transistors are Off. The quick follow-up response to change in the source/drain electrode voltage in the LSMOS transistors suppresses useless increase in the dead time. The increase in the dead time would increase the body diode conduction (through) time of the push-pull transistors and thereby increase internal loss, and theoretically such internal loss should be several tens of times larger than loss caused by on-resistance of the push-pull transistors. Therefore, the above means which shortens dead time for the push-pull output transistors of the switching regulator is useful in reducing power loss caused by the switching regulator.

In a preferred embodiment of the invention, the input MOS transistor includes: an N-type fourth well region formed in a P-type semiconductor substrate; a P-type fifth well region formed in the fourth well region; a drain region formed in the fourth well region; a source region formed in the fifth well region; a gate electrode formed through a gate insulating film over the fifth well region between the drain region and the source region; and an insulating layer formed between the gate electrode and the drain region.

For an electronic circuit which has, on a packaging substrate, a microprocessor and a power supply circuit for supplying operating power to the microprocessor, a plurality of semiconductor devices each including the above switching regulator may be used for the power supply circuit.

Main advantageous effects which are brought about by the present invention are briefly outlined below.

It is possible to realize an LDMOS transistor which quickens the follow-up response to change in the source/drain electrode voltage.

The use of such LDMOS transistors can suppress unwanted increase in dead time for switching regulator push-pull output transistors.

Power loss caused by such a switching regulator is reduced.

BRIEF DESCRIPTION OF THE DRAWINGS

The invention will be more particularly described with reference to the accompanying drawings, in which.

DETAILED DESCRIPTION OF THE PREFERRED EMBODIMENTS

Figure 1:
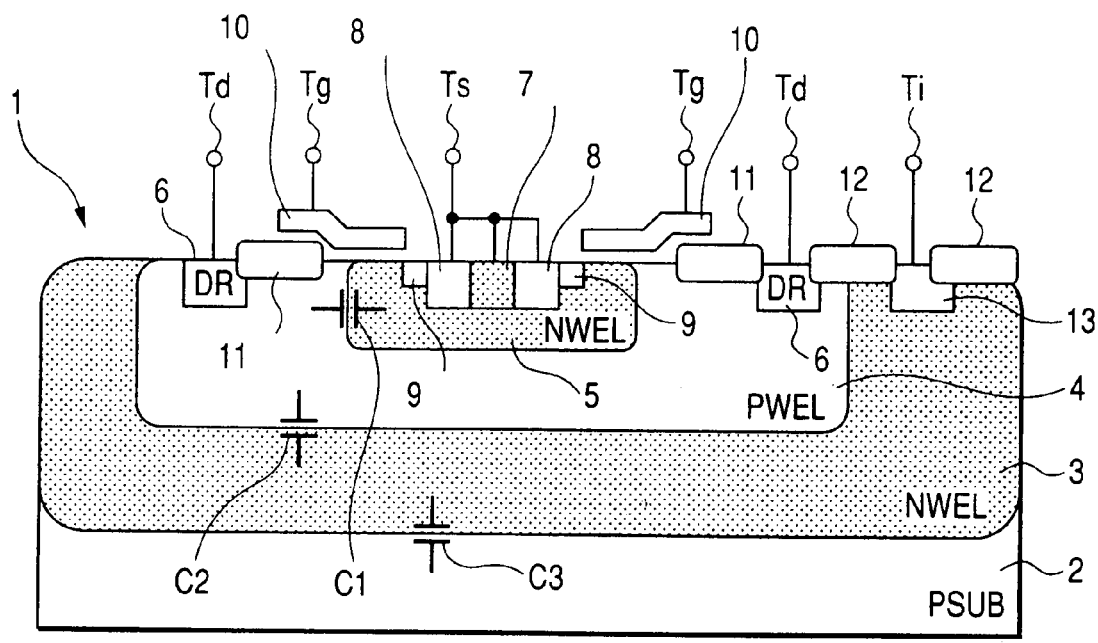
FIG. 1 is a cross-sectional view showing the device structure of a P-channel LDMOS transistor.

FIG. 1 shows the device structure of a P-channel LDMOS transistor. An LDMOS transistor formed over a P-type (first conduction type) semiconductor substrate (PSUB) 2 is shown here. The LDMOS transistor 1 includes: a first well region (NWEL) 3 as an N-type (second conduction type) low-concentration region formed in the P-type semiconductor substrate 2; a second well region (PWEL) 4 as a P-type low-concentration region formed in the first well region 3; and a third well region 5 as an N-type low-concentration region formed in the second well region 4. The regions 3, 4 and 5 are concentric with each other though not so limited. A circular drain region (DR) 6 is formed as a P-type high-concentration region in the second well region 4. A back gate region (BG) 7 is formed as an N-type high-concentration region in the center of the third well region 5 and a source region (SC) 8 is formed as a P-type high-concentration region in the third well region 5 in a manner to surround the back gate region 7. An LDD region (LDD) 9 as a P-type low-concentration region is added to the outer periphery of the source region 8. A gate electrode (GT) 10 is formed through a gate insulating film over the third well region between the drain region 6 and the source region 8. There is an insulating layer (LCS) 11 such as a LOCOS film between the gate electrode 10 and the drain region 6. 12 represents a LOCOS film. 13 represents an N-type high-concentration region. Td represents a drain terminal; Tg a gate terminal; Ts a source terminal; and Ti a well terminal.

Figure 2:
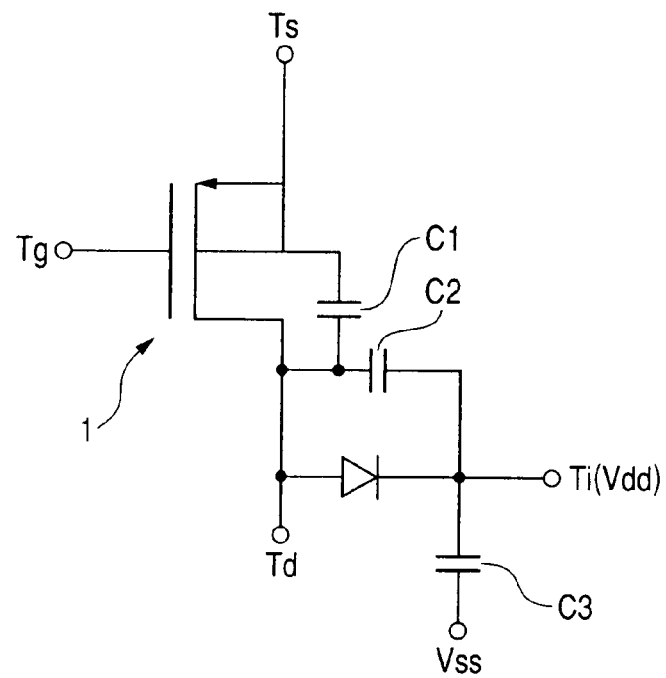
FIG. 2 is an equivalent circuit diagram for the LDMOS transistor of FIG. 1.

In the LDMOS transistor 1, a relatively large breakdown voltage is ensured between the drain and source because the drain region 6 is separated from the source region 8 through the second well region 4 and the third well region 5, and a relatively large breakdown voltage is ensured between the drain and gate because the gate electrode 10 is separated from the drain region 6 through the insulating layer 11 such as a LOCOS film. Here, between the drain and source of the LDMOS transistor 1 there is parasitic capacitance C1 of the junction of the second well region 4 and the third well region 5; between the drain and substrate there are parasitic capacitance C3 of the junction of the semiconductor substrate 2 and the first well region 3 and parasitic capacitance C2 of the junction of the first well region 3 and the second well region 4 in series; and between the source and substrate there are parasitic capacitance C3 of the junction of the semiconductor substrate 2 and the first well region 3, parasitic capacitance C2 of the junction of the first well region 3 and the second well region 4, and parasitic capacitance C1 of the conjunction with the second well region 4 in series. FIG. 2 shows the equivalent circuit concerned. As the source (drain) voltage of the LDMOS transistor 1 changes, parasitic capacitances C1, C2, and C3 function as unwanted delay components; however, because of the device structure, the parasitic capacitances between the semiconductor substrate and the source region are the series of parasitic capacitances C2 and C3 and both look relatively small, so that delay in the follow-up response to change in the source/drain electrode voltage is relatively small. This quickens the follow-up response to change in the source/drain electrode voltage. The follow-up response here means that the drain voltage changes in response to change in the source voltage level change and the source voltage changes in response to change in the drain voltage level.

Figure 3:
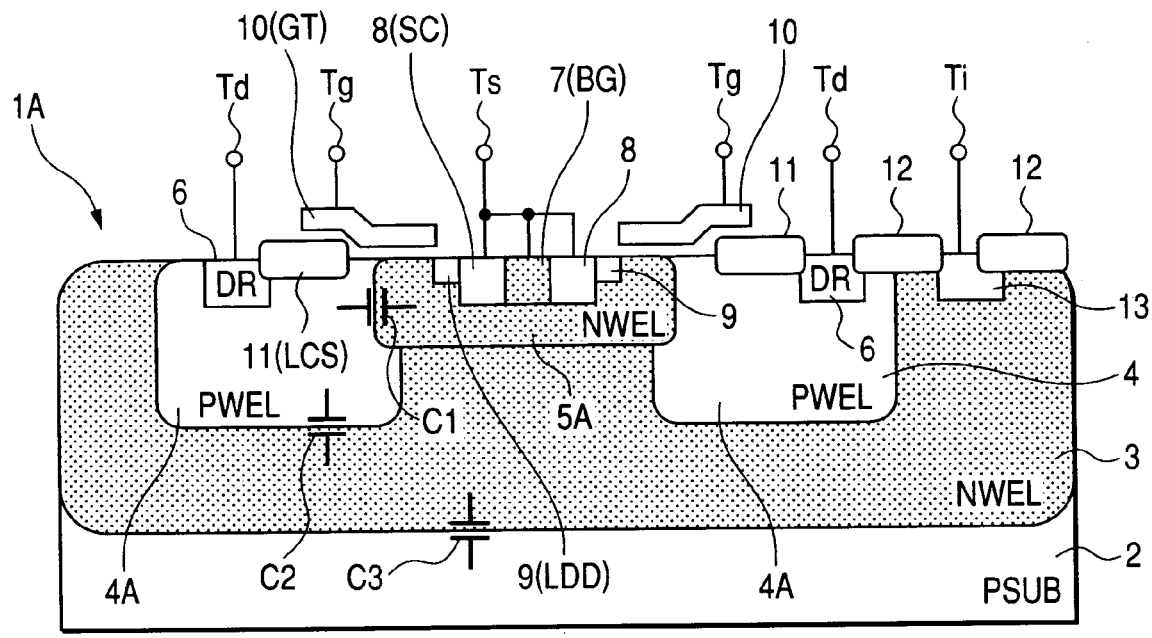
FIG. 3 is a cross-sectional view showing the device structure of the LDMOS transistor which the present inventors previously conceived.
Figure 4:
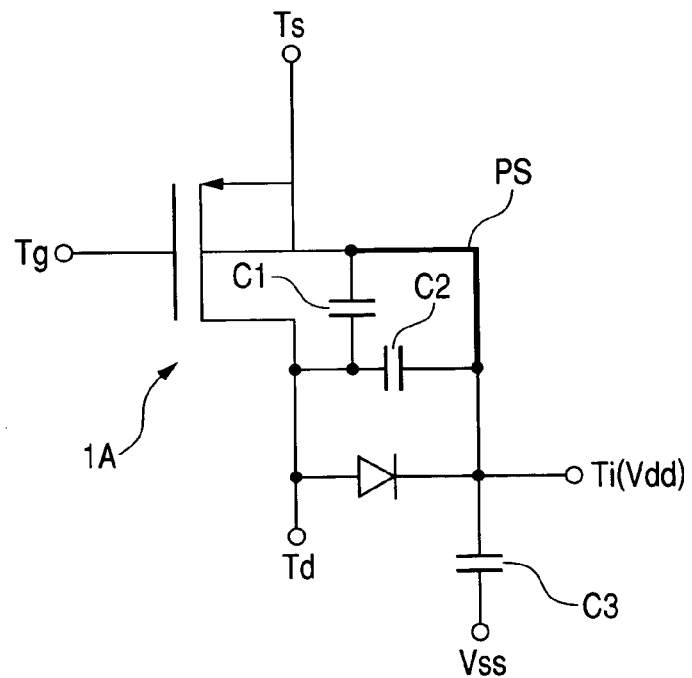
FIG. 4 is an equivalent circuit diagram for the LDMOS transistor of FIG. 3.

FIG. 3 shows the device structure of the LDMOS transistor which the present inventors previously conceived. The difference from FIG. 1 is that the third well region 5A is not surrounded by the second well region 4A in the first well region 3. The third well region 5A is in contact with the first well region 3. Between the drain and source of the LDMOS transistor 1A thus structured there is a parasitic capacitance of the junction of the second well region 4A and the third well region 5A; between the drain and substrate there are parasitic capacitance C3 of the junction of the semiconductor substrate 2 and the first well region 3 and parasitic capacitance C2 of the junction of the first well region 3 and the second well region 4A in series; and between the source and substrate there is parasitic capacitance C3 of the junction of the semiconductor substrate 2 and the first well region 3. FIG. 4 shows the equivalent circuit concerned. The difference from the equivalent circuit of FIG. 2 is that a path PS exists in the equivalent circuit of FIG. 4 according to the comparative example. As apparent from the equivalent circuit of FIG. 4, the parasitic capacitance C3 is directly connected with the source region 8. Therefore, a relatively large delay occurs in follow-up to voltage change of the source terminal Ts in the LDMOS transistor 1A.

Next, the method of manufacturing the LDMOS transistor 1 of FIG. 1 will be explained. First, for example, using a resist film (not shown) formed over the P-type semiconductor substrate 2 as a mask, N-type impurity ions are implanted into desired regions of the substrate 2 and the impurity is diffused so that an N-type well region 3 is formed. In this process, for example, phosphorus ions as N-type impurity are implanted at an accelerating voltage of approx. 120 KeV with a rate of $8.0 \times 10^{12}/cm^2$ and these phosphorus ions are thermally diffused at approx. 1200° C. for six hours.

Using the first resist film formed over the substrate 2 as a mask, N-type impurity (for example, phosphorus ions) is implanted and after the first resist film is removed, using a second resist film (not shown) as a mask, P-type impurity (for example, boron ions) is implanted and diffused to form a P-type well region 4 in the N-type well region 3 and an N-type well region 5 in the P-type well region. In this process, for example, after phosphorus ions are implanted at an accelerating voltage of approx. 120 KeV with a rate of $1.6 \times 10^{13}/cm^2$, they are thermally diffused at approx. 1050° C. for two hours. Also, for example, after boron ions are implanted at an accelerating voltage of approx. 80 KeV with a rate of $2.0 \times 10^{13}/cm^2$, they are thermally diffused at approx. 1050° C. for two hours.

Next, a gate insulating film and an element isolating film 11 and 12 are formed over the substrate 1. Then, a gate electrode with a film thickness of approx. 400 nm is formed. Though not so limited, the gate electrode 9 consists of a polysilicon film which is made conductive by doping with phosphorus ions using $POCl_3$ as a thermal diffusion source. Furthermore, the electrode may be a polycide electrode which has a tungsten silicide (WSix) film, etc. stacked over the polysilicon film. In addition, P-type impurity is implanted in a source formation region formed in the N-type region 9 and a drain formation region formed in the P-type region 4 using a resist film with openings as a mask to form P-type (p+) regions 6 and 8 as a drain and a source region. In order to remove electrons from the regions 5 and 3, boron ions are implanted; as a consequence, N-type high-concentration regions 7 and 13 are formed.

Figure 5:
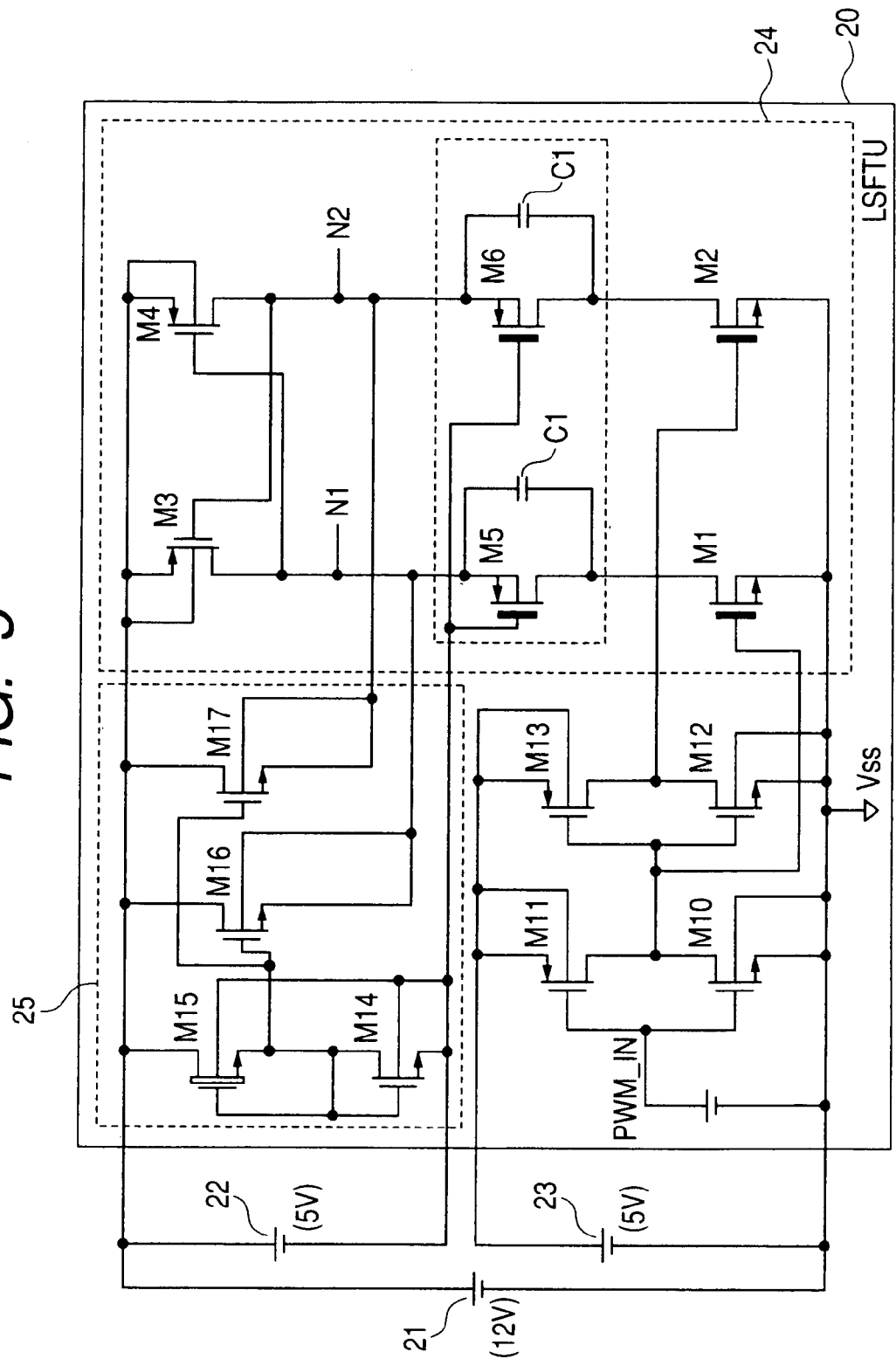
FIG. 5 is a circuit diagram showing a level shift circuit which uses LDMOS transistors of FIG. 1.

FIG. 5 shows a level shift circuit (LSFTU) 20 which uses LDMOS transistors of the same type as shown in FIG. 1. M1 and M2 represent a pair of N-channel differential input MOS transistors and M5 and M6 represent P-channel LDMOS transistors. LDMOS transistors have a so-called breakdown voltage of 20 V. M3, M4 and M10 to M17 are MOS transistors which have a breakdown voltage of 5 V. Regarding MOS transistor symbols, those with an arrow indicating the source-to-gate direction denote P-channel MOS transistors and those with an arrow indicating the gate-to-source direction denote N-channel MOS transistors.

An output circuit 24 includes: a pair of N-channel differential input MOS transistors M1, M2; a pair of P-channel clamping MOS transistors M5, M6 which are connected with the drains of the differential input MOS transistors M1, M2, respectively; and a pair of P-channel load MOS transistors M3, M4 which are connected with the sources of the clamping MOS transistors M5, M6 respectively. The pair of load MOS transistors M3, M4 is cross-connected where the gate electrode of one transistor is connected with the drain electrode of the other transistor and the gate electrode of the other transistor is connected with the drain electrode of the one transistor. 21 denotes a 12 V power supply and 22 and 23 denote 5 V power supplies. MOS transistors M14 to M17 constitute a bias circuit 25. When an input signal is biased (for example =0V), the gate of M1 is On. At this time, the gate of M3 is Off and no current flows through N1. For this reason, M5 cannot work as a transistor and cannot output clamping voltage (7 V) through its source. In order to activate M5, minute drain current must be supplied. It is a clamping circuit that generates this minute current. M14 and M15 produce minute current and when N1 is equal to the source voltage of M14, the minute current produced by M14 and M15 is supplied through M16 to keep the clamping circuit active. PWM_IN is a pulse-width modulated pulse signal with amplitude of 5 V. The pulse signal PWM_IN is inverted through a CMOS inverter (composed of M10 and M11) and sent into the gate of the one input MOS transistor M1. Output of the CMOS inverter composed of M10 and M11 is inverted through a CMOS inverter composed of M12 and M13 and sent into the gate of the other input MOS transistor M2. In response to a differential input supplied to the pair of differential input MOS transistors M1 and M2, the output circuit 24 outputs, from nodes N1 and N2, a signal with amplitude of 7-12 V which is level-shifted with respect to the amplitude of 5 V of the differential input. Here, when the input transistors M1, M2 are turned On/Off, the parasitic capacitance C1 between the source and drain of the MOS transistor M5 (M6) works so as to quickly transmit change in the drain (source) voltage of M5 (MG) to the source (drain) by capacitive coupling with C1. At this time, since a relatively large parasitic capacitance C3 as shown in the equivalent circuit of FIG. 4 is not directly connected between the semiconductor substrate and the source, no unwanted large delay occurs in the source/drain follow-up response of the MOS transistor M5 (MG).

Figure 6:
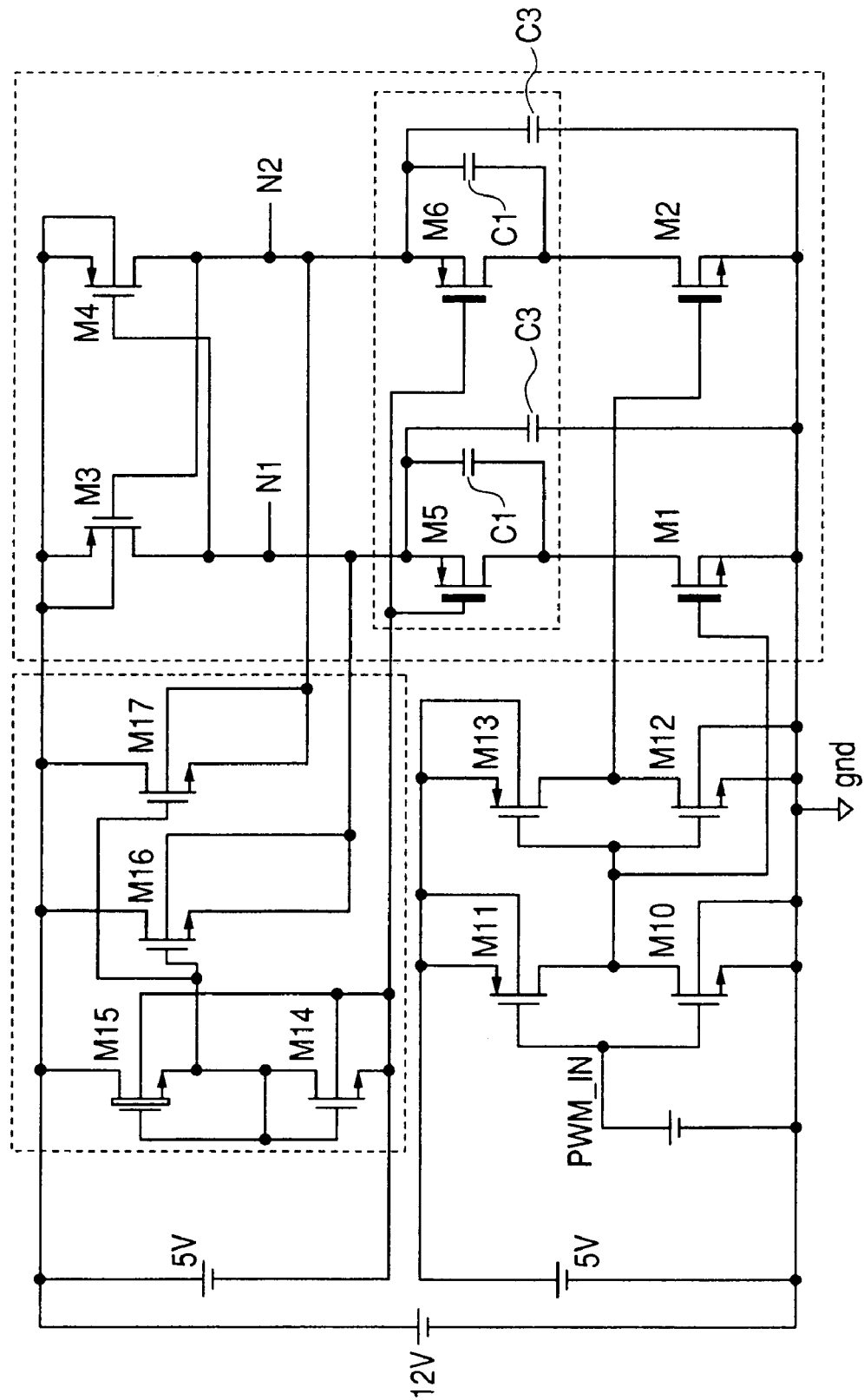
FIG. 6 is a circuit diagram showing a level shift circuit which uses LDMOS transistors according to the comparative example of FIG. 3 for clamping MOS transistors.

FIG. 6 shows a level shift circuit which uses LDMOS transistors 1A according to the comparative example of FIG. 3 for clamping MOS transistors M5, M6. Here, relatively large parasitic capacitance C3 is seen from the source of M5 (M6).

Figure 7:
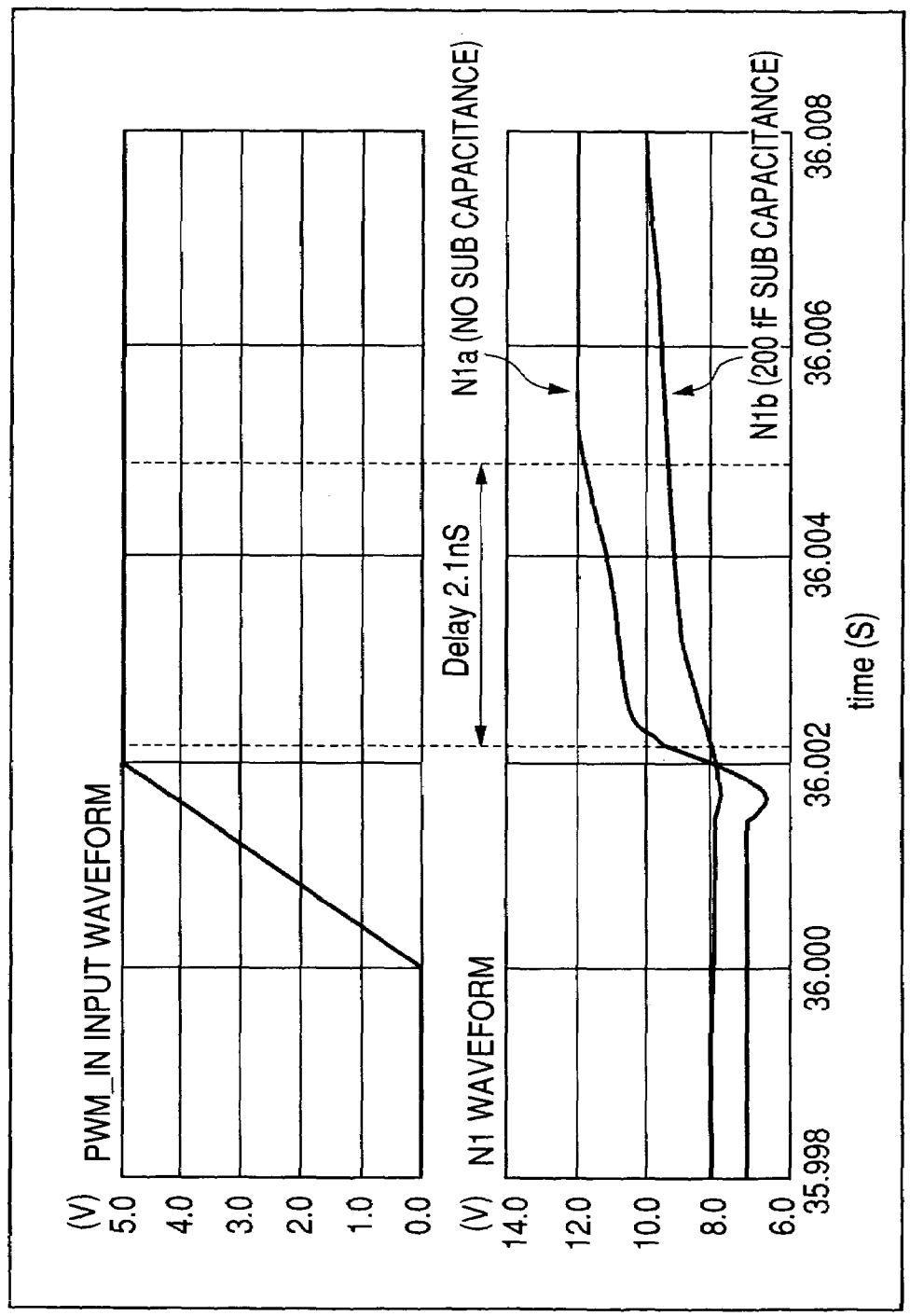
FIG. 7 is a waveform chart showing simulation waveforms of output node N1 in relation to change in input pulse PWM_IN.
Figure 8:
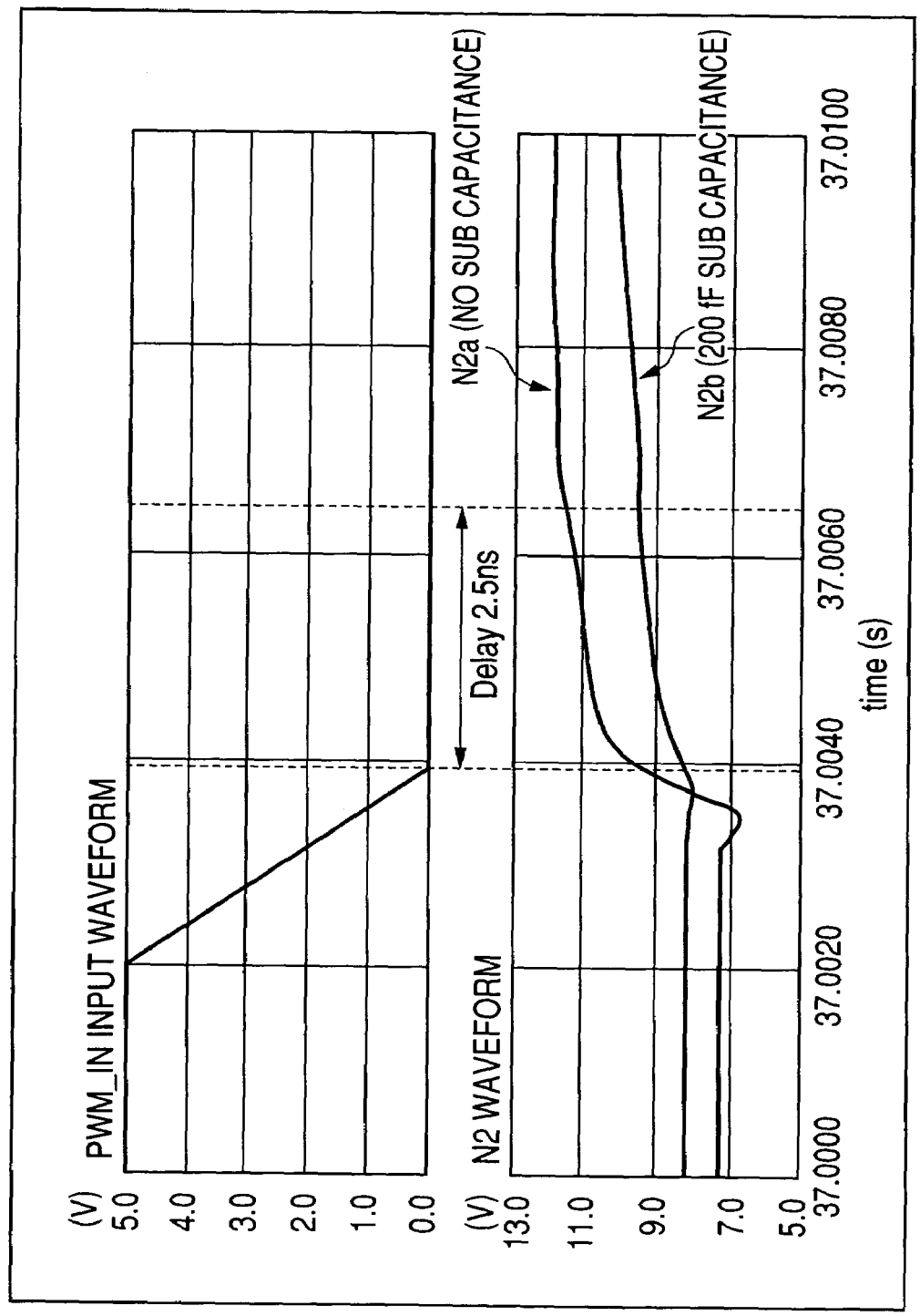
FIG. 8 is a waveform chart showing simulation waveforms of output node N2 in relation to change in input pulse PWM_IN.

FIG. 7 shows simulation waveforms of output node N1 in relation to change in input pulse PWM_IN and FIG. 8 shows simulation waveforms of output node N2 in relation to change in input pulse PWM_IN. N1*a* and N2*a* concern the case of FIG. 5 in which the LDMOS transistor 1 is used and there is virtually no substrate capacitance (SUB capacitance) as seen from the source. N1*b* and N2*b* concern the case of FIG. 6 in which the LDMOS transistor 1A is used and the substrate capacitance (SUB capacitance) seen from the source is, for example, 200 fF. According to the simulation result, as shown in FIG. 7 there is a delay of 2.1 nanoseconds from the time when N1*a* exceeds the threshold voltage (9.45 V, center voltage between 7-12 V) until the time when N1*b* exceeds the threshold voltage (9.45 V, center voltage between 7-12 V). As shown in FIG. 8 there is a delay of 2.5 nanoseconds from the time when N2*a* exceeds the threshold voltage (9.45 V, center voltage between 7-12 V) until the time when N2*b* exceeds the threshold voltage (9.45 V, center voltage between 7-12 V).

Figure 9:
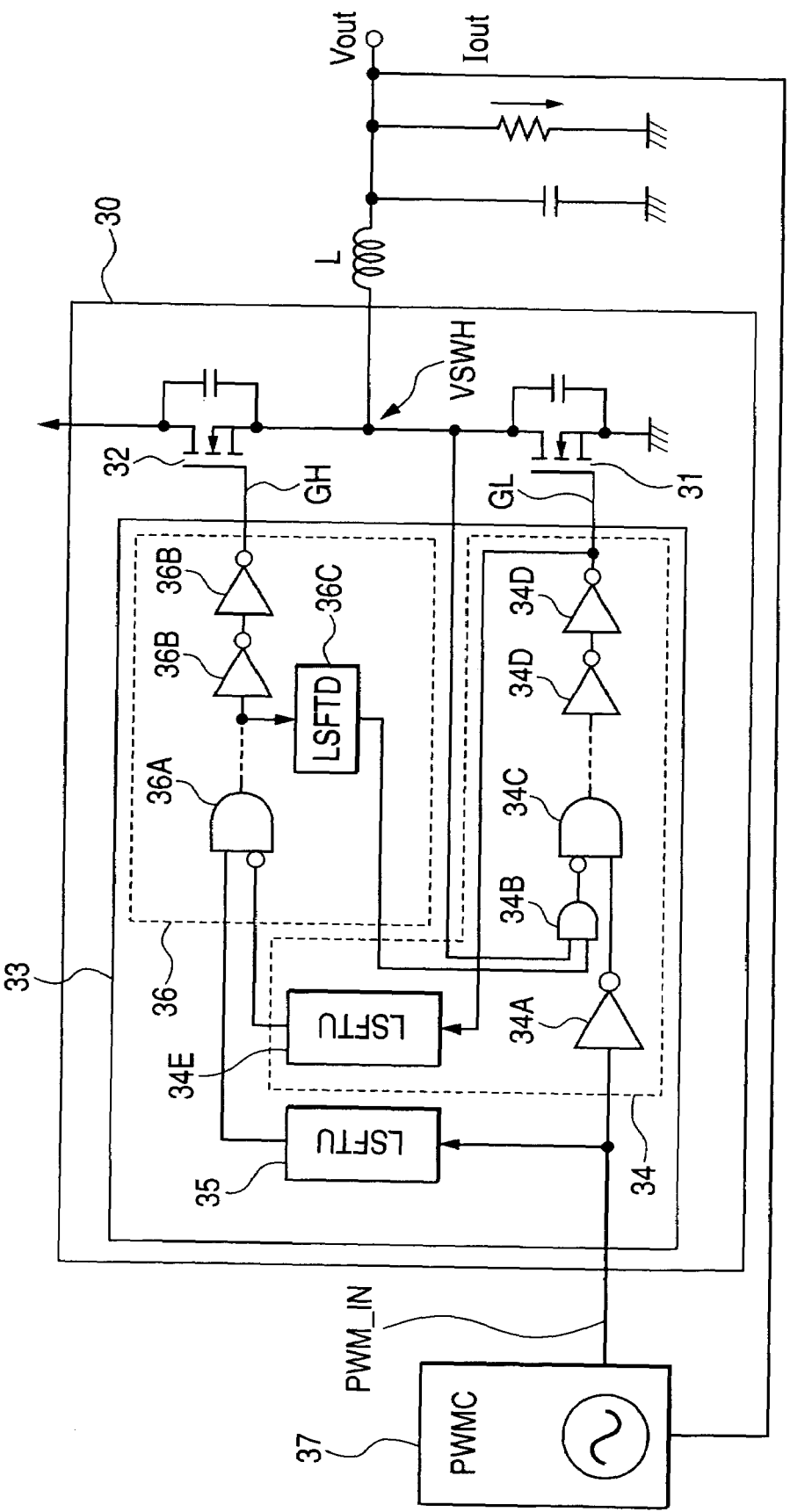
FIG. 9 is a circuit diagram showing a stepdown switching regulator which uses the level shift circuit of FIG. 5.

FIG. 9 shows a stepdown switching regulator which uses the above level shift circuit (LSFTU) 20. A switching regulator 30 is a package which contains: an N-channel first power MOS transistor 31 and an N-channel second power MOS transistor 32, both designed for push-pull operation, and a driver IC 33 which generates switching control signals GL and GH to drive the first power MOS transistor 31 and the second power MOS transistor 32 for push-pull operation. FIG. 9 also shows Vout, an output voltage; Iout, an output current; and L, an inductance.

The driver IC 33 has a first logical circuit 34, a level shift circuit 35 and a second logical circuit 36. The first logical circuit receives pulse signal PWM_IN with an amplitude determined by a first operating supply voltage (0-5 V), generates switch control signal GL for the first power MOS transistor 31 and operates at the first operating supply voltage (0-5 V). The level shift circuit 35 shifts the amplitude of the pulse signal PWM_IN to a second operating supply voltage (7-12 V), a level higher than the first operating supply voltage. The second logical circuit 36 receives output from the level shift circuit 35, generates switch control signal GH for the second power MOS transistor 32, and operates at the second operating supply voltage (7-12 V). The pulse signal PWM_IN is outputted from a pulse width modulation circuit (PWMC) 37.

The first logical circuit 34 consists of an inverter 34A, an AND gate 34B, an AND gate 34C, an even-numbered step inverter 34F connected with the AND gate 34C serially, and a level shift circuit (LSFTU) 34E which shifts signal GL to the second operating supply voltage (7-12 V), a level higher than the first operating supply voltage (0-5 V). The second logical circuit 36 consists of an AND gate 36A, an even-numbered step inverter 36B connected with the AND gate 36A serially, and a level shift circuit (LSFTU) 36C which shifts output from the AND gate 36A to the first operating supply voltage (0-5 V), a level lower than the second operating supply voltage (7-12 V). The level shift circuits 35 and 34E are the same as the level shift circuit of FIG. 5. The level shift circuit 36C is configured as follows (not shown): P-type differential input MOS transistors M1, M2 (instead of N-type ones) are disposed on a 12 V power supply side and N type clamping MOS transistors M5, M6 (instead of P-type ones) are disposed under them, and N-type load MOS transistors M3, M4 (instead of P-type ones) are disposed between the clamping MOS transistors M5, M6 and the ground Vss. The bias circuit operates at 0-5 V; 5 V is supplied to the gate of the clamping MOS transistors M5, M6 and a signal with amplitude of 7-12 V is sent into the gates of the differential input MOS transistors.

The first logical circuit 34 turns On the first power MOS transistor 31 after the second power MOS transistor 32 is turned Off; and the second logical circuit 36 turns On the second power MOS transistor 32 after the first power MOS transistor 31 is turned Off. The signal line from the inverter 34D through the level shift circuit 34E to the AND gate 36A is a path for notifying the second logical circuit 36 that the power MOS transistor 31 is turned Off. On the other hand, the line from the output of the AND gate 36A through the level shift circuit 36C to the AND gate 34B is a path for notifying the first logical circuit that the power MOS transistor IC 32 is turned Off. Output voltage VSWH is sent to the other input of the AND gate 34B.

Figure 10:
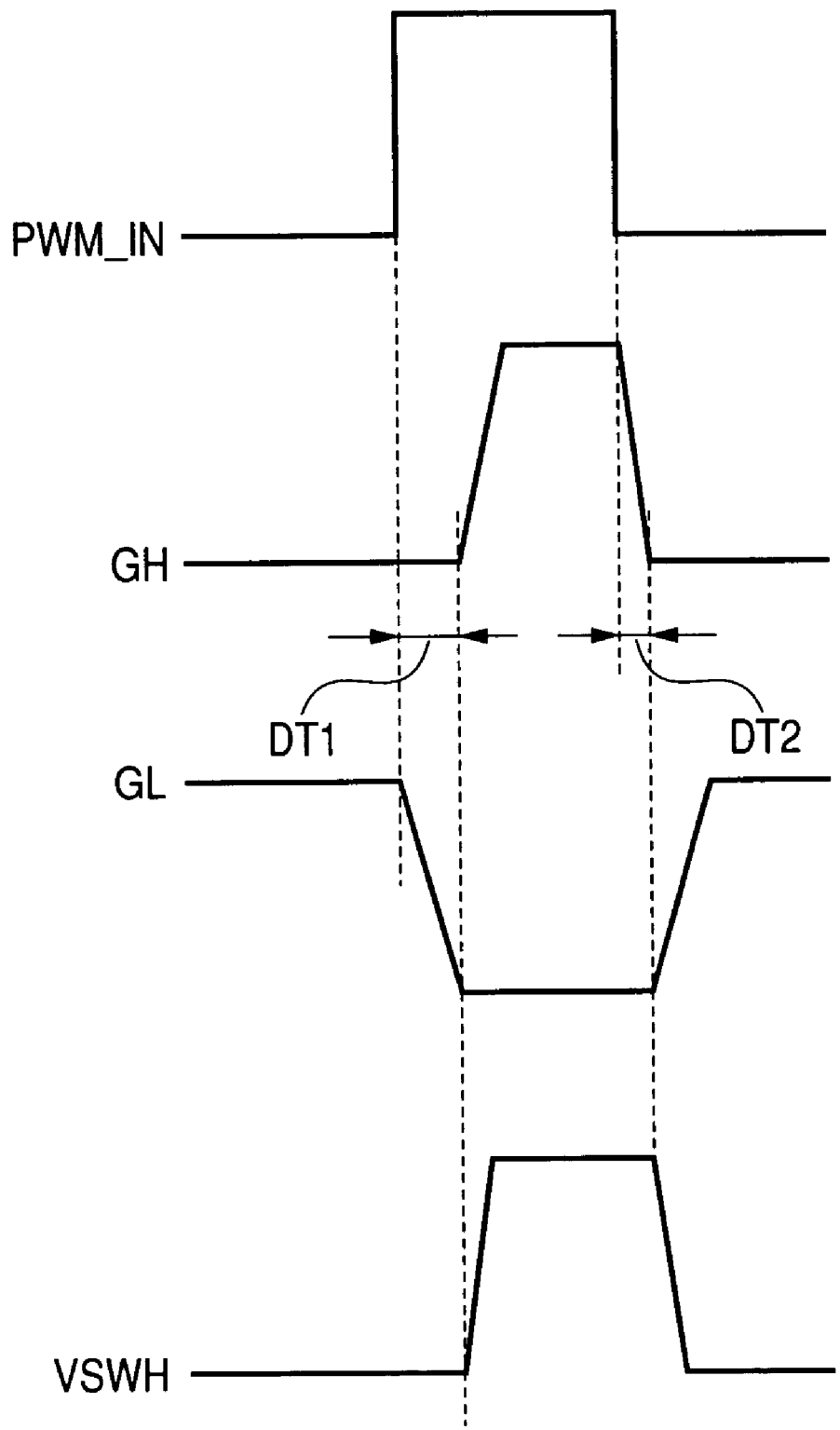
FIG. 10 illustrates dead times in push-pull operation of a power MOS transistor IC.
Figure 11:
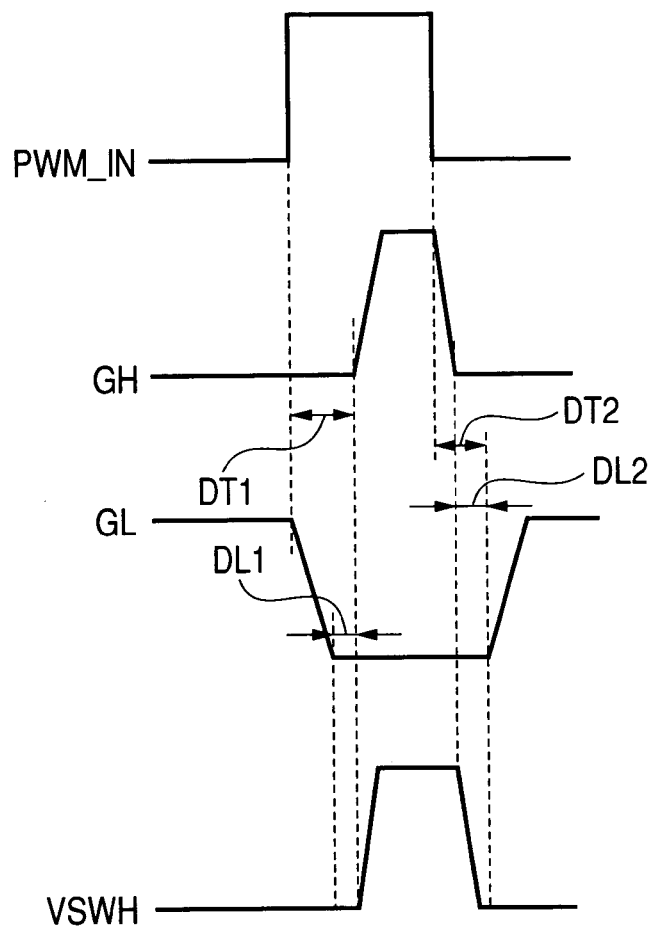
FIG. 11 is a waveform chart showing signal waveforms with increased dead times as a comparative example.
Figure 12:
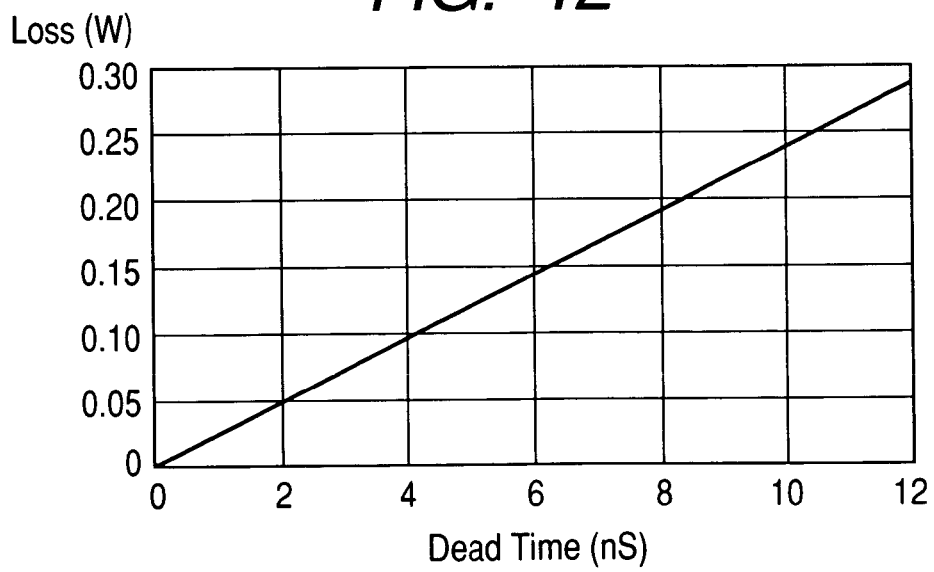
FIG. 12 illustrates a typical relation between dead time and power loss.

The first logical circuit 34 and the second logical circuit 36 work in conjunction with each other as follows: the second (first) logical circuit turns On the power MOS transistor 32 (31) after detecting that the power MOS transistor 31 (32) is turned Off. In other words, as shown in FIG. 10, in order to prevent through current in the push-pull output transistors 31, 32 of the switching regulator 30, the first logical circuit 34 and the second logical circuit 36 control push-pull operation in a way to create, in a switching transition period, dead times DT1, DT2 in which both the transistors are Off. In the level shift circuits 35, 34E and 36C, the LDMOS transistors which function as the P-channel clamping MOS transistors quicken the follow-up response to change in the source/drain electrode voltage as mentioned earlier. The quick follow-up response to change in the source/drain electrode voltage of the LDMOS transistors suppresses useless increase in dead times DT1, DT2. FIG. 11 shows signal waveforms with increased dead times as a comparative example. DL1 and DL2 denote delay times in shifting by level shift circuits. Electric current flows through the body diode of the power MOS transistor 31 during the periods of DL1 and DL2. The increase in dead times DT1 and DT2 would increase internal loss of current caused by the parasitic diode of the push-pull transistors 31, 32 and theoretically such internal loss should be several tens of times larger than loss caused by on-resistance of the push-pull transistors. For example, power loss (PLon) with the transistor 32 On and power loss (PLoff) with the transistor 32 Off are considered as follows. The relations shown below exist under the condition that the on-resistance of the transistor 32 (Ron) is 1 mΩ, the current is 25 A and the duty ratio is 2.5/1000 and the parasitic diode forward voltage (VF) is 0.8 V:

$PLon = Ron \times I^2 = 1\ m\Omega \times 25^2 \times 2.5/1000 = 1.6\ mW$ $PLoff = 25 \times 0.8 \times 2.5/1000 = 50\ mW$ FIG. 12 shows a typical relation between dead time and power loss.

Therefore, the level shift circuits 35, 34E and 36C using the above LDMOS device which shortens dead time for the push-pull output transistors 31, 32 of the switching regulator 30 are useful in reducing power loss caused by the switching regulator 30.

Figure 13:
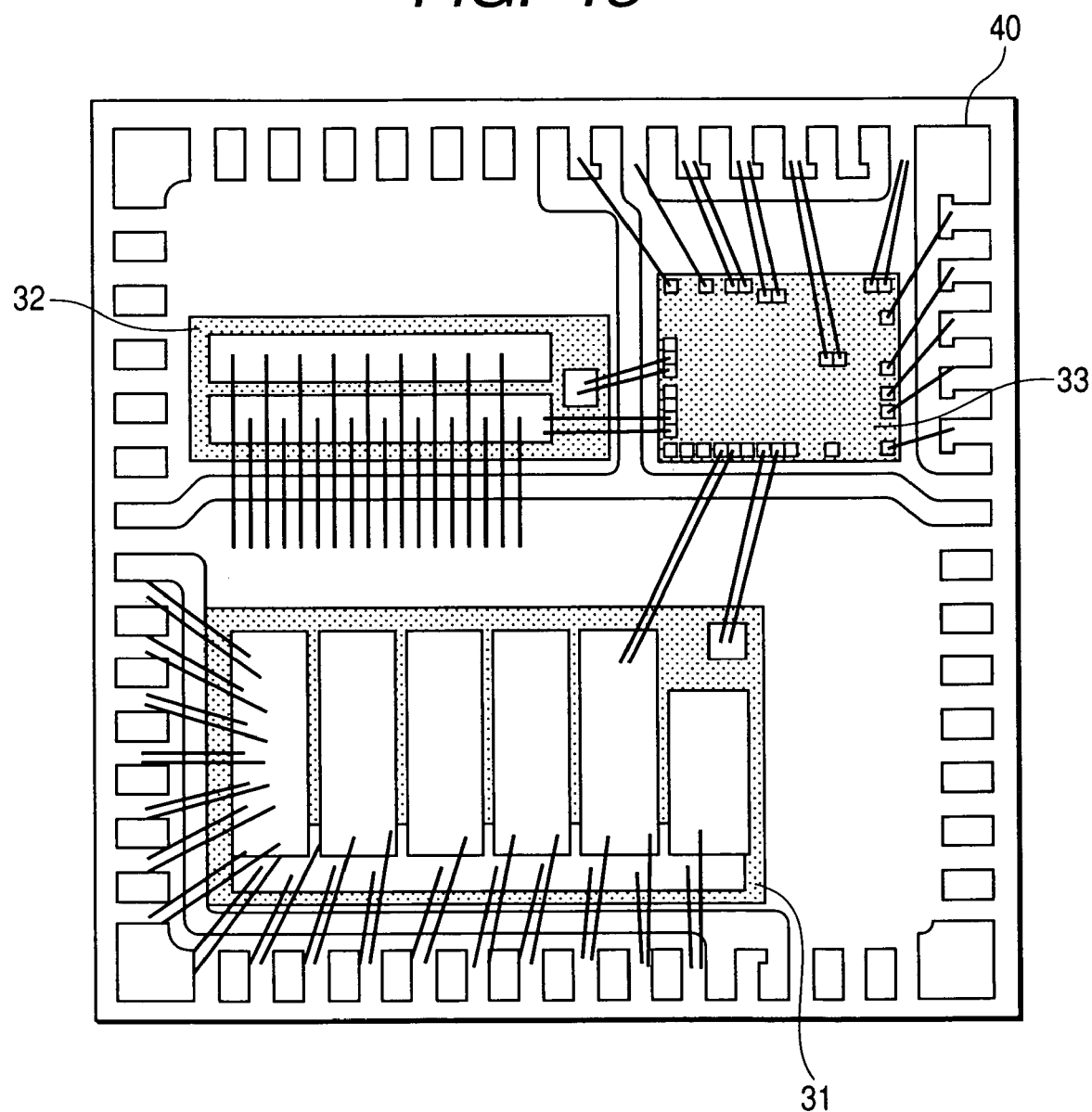
FIG. 13 exemplifies the stepdown switching regulator of FIG. 9 in assembled form.

FIG. 13 shows the stepdown switching regulator 30 of FIG. 9 in assembled form. Shown here are the first power MOS transistor 31, the second power MOS transistor 32 and the driver IC 33 which are mounted in a lead frame 40 where the IC pads are bonded to corresponding lead terminals. The switching regulator 30 as a semiconductor device is resin-molded with the lead terminals exposed.

Figure 14:
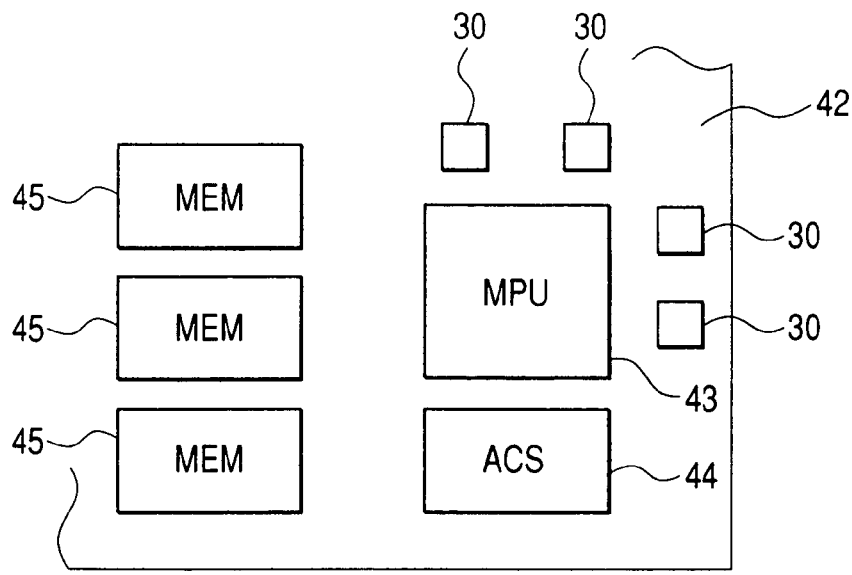
FIG. 14 is a schematic block diagram showing an electronic circuit which uses switching regulators.
Figure 15:
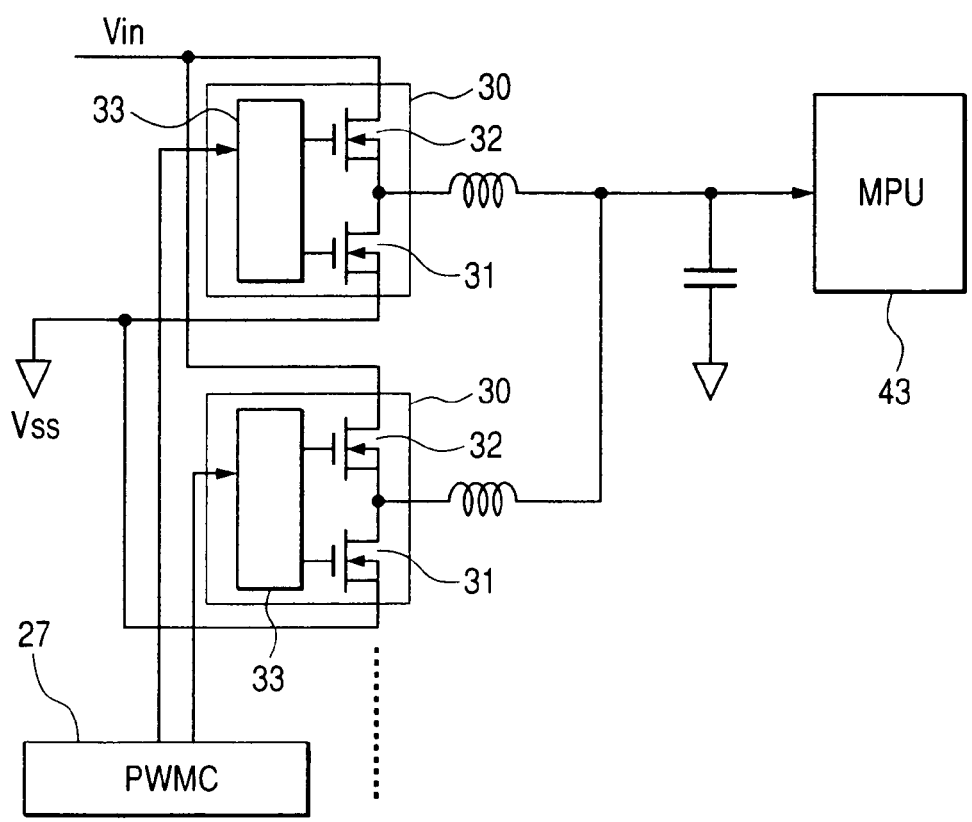
FIG. 15 is a circuit diagram showing switching regulators connected in a circuit on a packaging substrate.

FIG. 14 shows an electronic circuit which uses switching regulators. The electronic circuit shown in the figure is a processor board like a workstation mother board which consists of a packaging substrate 42 on which a microprocessor (MPU) 43, an accelerator (ACS) 44, memories (MEM) 45, and switching regulators 30 are typically mounted. Here, the switching regulators 30 are power supply circuits for the MPU 43. Each of the switching regulators 30 has a current supply capacity of 25 A. The switching regulators 30 could be directly mounted onto wiring on the packaging substrate 42. However, doing so might increase signal delay from the driver IC 33 to the power MOS transistors IC31, IC32 for the packaging substrate 42 and thus lengthen the above dead time. In this sense, a semiconductor device configuration as shown in FIG. 13 in which circuit connections are completed with the switching regulators 30 mounted in a single lead frame will be effective in reducing unwanted increase in the above dead time. FIG. 15 shows switching regulators 30 connected in a circuit. Also shown is Vss, a supply voltage.

Figure 16:
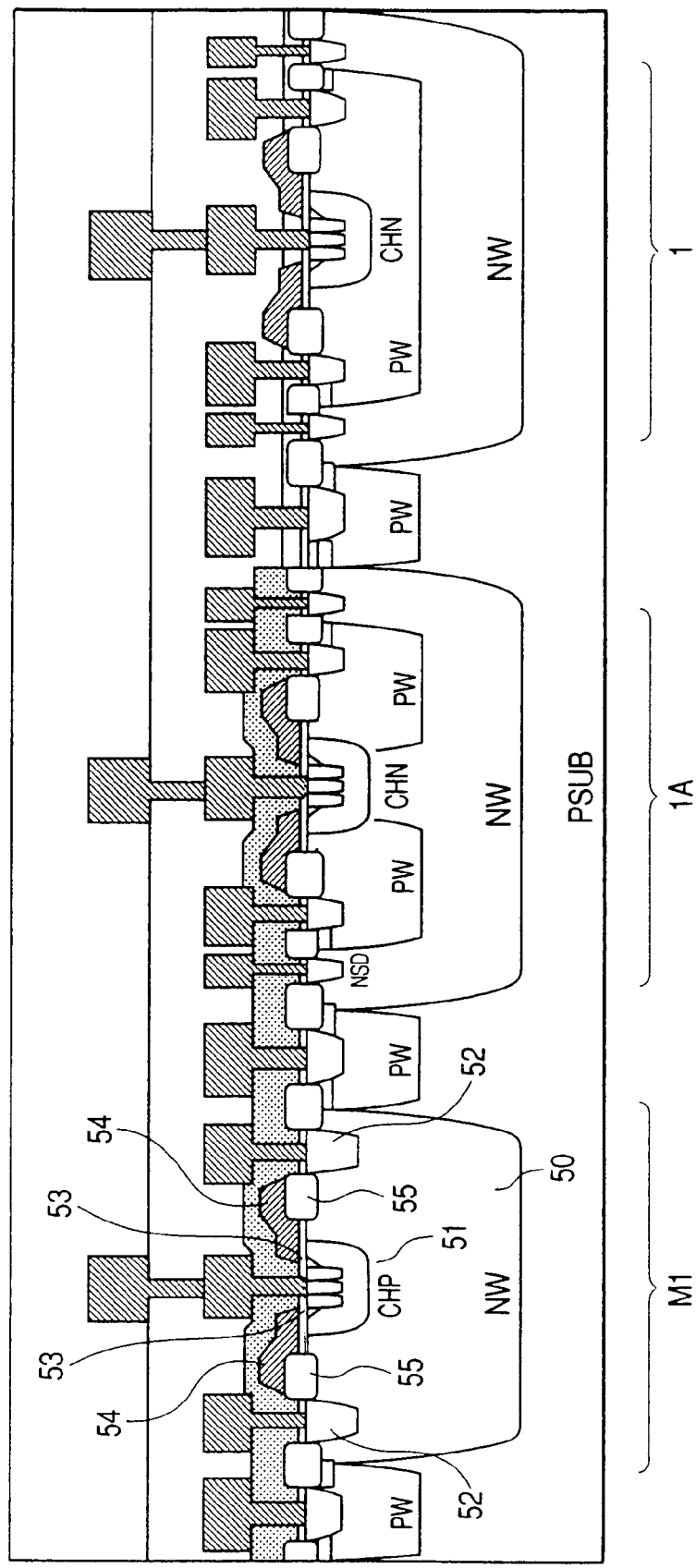
FIG. 16 is a longitudinal sectional cross-sectional view showing P-channel and N-channel LDMOS transistors in section.

FIG. 16 is a cross-sectional view showing the MOS transistors 1, 1A and M1 together. NW represents an N-type well region; PW a P-type well region; CHN an N-channel formation region; and CHP a P-channel formation region. The transistor M1 includes: an N-type fourth well region 50 formed in a P-type semiconductor substrate (PSUB); a P-type fifth well region 51 formed in the fourth well region 50; a drain region 52 formed in the fourth well region 50; a source region 53 formed in the fifth well region 51; a gate electrode 54 formed through a gate insulating film over the fifth well region 51 between the drain region and the source region; and an insulating layer 55 formed between the gate electrode and the drain region.

The invention made by the present inventors has been so far explained in reference to preferred embodiments thereof. However, the invention is not limited thereto and it is obvious that these details may be modified in various ways without departing from the spirit and scope thereof.

For example, the source region and drain region need not be concentric with each other. The LDMOS transistor according to the present invention may be applied to circuits other than level shift circuits. The level shift circuit may be used for a device other than a switching regulator.

What is claimed is:

1. A semiconductor integrated circuit having an LDMOS transistor formed over a first conductivity type semiconductor substrate,
the LDMOS transistor comprising:
a second conductivity type first well region formed in the first conductivity type semiconductor substrate;
a first conductivity type second well region formed in the first well region;
a second conductivity type third well region formed in the second well region;
a drain region formed in the second well region;
a source region formed in the third well region;
a gate electrode between the drain region and the source region;
an insulating layer formed between the gate electrode and the drain region,
wherein the first conductivity type refers to P type and the second conductivity type refers to N type, and the LDMOS transistor is of the P-channel type; and
a level shift circuit which uses the P-channel LDMOS transistor, the level shift circuit comprising:
a pair of N-channel differential input MOS transistors;
a pair of P-channel clamping MOS transistors which are coupled with the drains of the differential input MOS transistors respectively; and
a pair of P-channel load MOS transistors which are coupled with the sources of the clamping MOS transistors respectively,
wherein the P-channel clamping MOS transistors are the LDMOS transistors;
wherein the pair of load MOS transistors are cross-coupled, with the gate electrode of one load MOS transistor coupled with the drain electrode of the other load MOS transistor and the gate electrode of the other load MOS transistor coupled with the drain electrode of the one load MOS transistor; and
wherein, in response to a differential input supplied to the pair of differential input MOS transistors, a signal which is level-shifted with respect to the amplitude of the differential input is outputted from the source electrodes of the pair of clamping MOS transistors.

2. A semiconductor device constituting a stepdown switching regulator which has a first power MOS transistor and a second power MOS transistor, both power MOS transistors designed for push-pull operation, and a driver IC which generates a switching control signal to drive the first power MOS transistor and the second power MOS transistor for push-pull operation,
the driver IC comprising:
a first logical circuit which receives a clock signal with an amplitude determined by a first operating supply voltage, generates a switch control signal for the first power MOS transistor and operates at the first operating supply voltage;
a level shift circuit which shifts the amplitude of the clock signal to a second operating supply voltage having a higher level than the first operating supply voltage; and
a second logical circuit which receives output from the level shift circuit, generates a switch control signal for the second power MOS transistor, and operates at the second operating supply voltage;
wherein the first logical circuit turns On the first power MOS transistor after the second power MOS transistor is turned Off; and the second logical circuit turns On the second power MOS transistor after the first power MOS transistor is turned Off,
the level shift circuit comprising:
a pair of N-channel differential input MOS transistors;
a pair of P-channel clamping MOS transistors which are coupled with the drains of the differential input MOS transistors respectively; and
a pair of P-channel load MOS transistors which are coupled with the sources of the clamping MOS transistors respectively;
wherein the pair of load MOS transistors are cross-coupled, with the gate electrode of one load MOS transistor coupled with the drain electrode of the other load MOS transistor and the gate electrode of the other load MOS transistor coupled with the drain electrode of the one load MOS transistor;
wherein an inverted signal of the clock signal and a noninverted signal are inputted into the pair of differential input MOS transistors and in response to this input, a level-shifted signal with respect to the amplitude of the differential input is outputted from the source electrodes of the pair of clamping MOS transistors; and
wherein the P-channel clamping MOS transistors are LDMOS transistors, the LDMOS transistor comprising:
an N-type first well region formed in a P-type semiconductor substrate;
a P-type second well region formed in the first well region;
an N-type third well region formed in the second well region;
a drain region formed in the second well region;
a source region formed in the third well region;
a gate electrode between the drain region and the source region; and
an insulating layer formed between the gate electrode and the drain region.

3. The semiconductor device according to claim 2, wherein the stepdown switching regulator is packaged into one package.

4. The semiconductor device according to claim 3, wherein the differential input MOS transistor comprises:
an N-type fourth well region formed in a P-type semiconductor substrate;
a P-type fifth well region formed in the fourth well region;
a drain region formed in the fourth well region;
a source region formed in the fifth well region;
a gate electrode between the drain region and the source region; and
an insulating layer formed between the gate electrode and the drain region.

5. An electronic circuit having, on a packaging substrate, a microprocessor and a power supply circuit for supplying operating power to the microprocessor,
wherein the power supply circuit includes a plurality of semiconductor devices according to claim 3.

* * * * *